United States Patent [19]

Krause et al.

[11] Patent Number: 4,617,554
[45] Date of Patent: Oct. 14, 1986

[54] KEYBOARD SCANNING

[75] Inventors: Charles A. Krause, Stevensville, Mich.; Randy J. Vander Heyden, Garland, Tex.

[73] Assignee: Zenith Electronics Corporation, Glenview, Ill.

[21] Appl. No.: 527,131

[22] Filed: Aug. 26, 1983

[51] Int. Cl.[4] .............................................. G11C 19/00
[52] U.S. Cl. ............................ 340/365 E; 340/365 R
[58] Field of Search ............. 340/365 E, 365 R, 365 S

[56] References Cited

U.S. PATENT DOCUMENTS 4,106,011  8/1978  Melanson et al. ............... 340/365 E Primary Examiner—John W. Caldwell, Sr.
Assistant Examiner—T. Rittmaster

[57] ABSTRACT

A multi-key keyboard is scanned at high speed in such a manner as to substantially reduce erroneous key entries caused by the simultaneous engagement of more than one key. A keyboard processor determines which key is down by sequential scanning of the keyboard, encodes the selected key and sends this code to a master processor, or CPU. A 2-key lockout scanning approach is employed wherein keyboard scanning stops when two keys are selected simultaneously. Scanning is resumed when either one or both of the first two keys are released. By limiting simultaneous key engagement detection to two keys, system complexity and cost are kept within reasonable limits while insuring against erroneous key entries. Detecting and storing the key engagement sequence permits a selected special function, e.g., automatic key repeat, to be applied to the last selected key rather than to an earlier selected, but simultaneously engaged, key.

11 Claims, 4 Drawing Figures

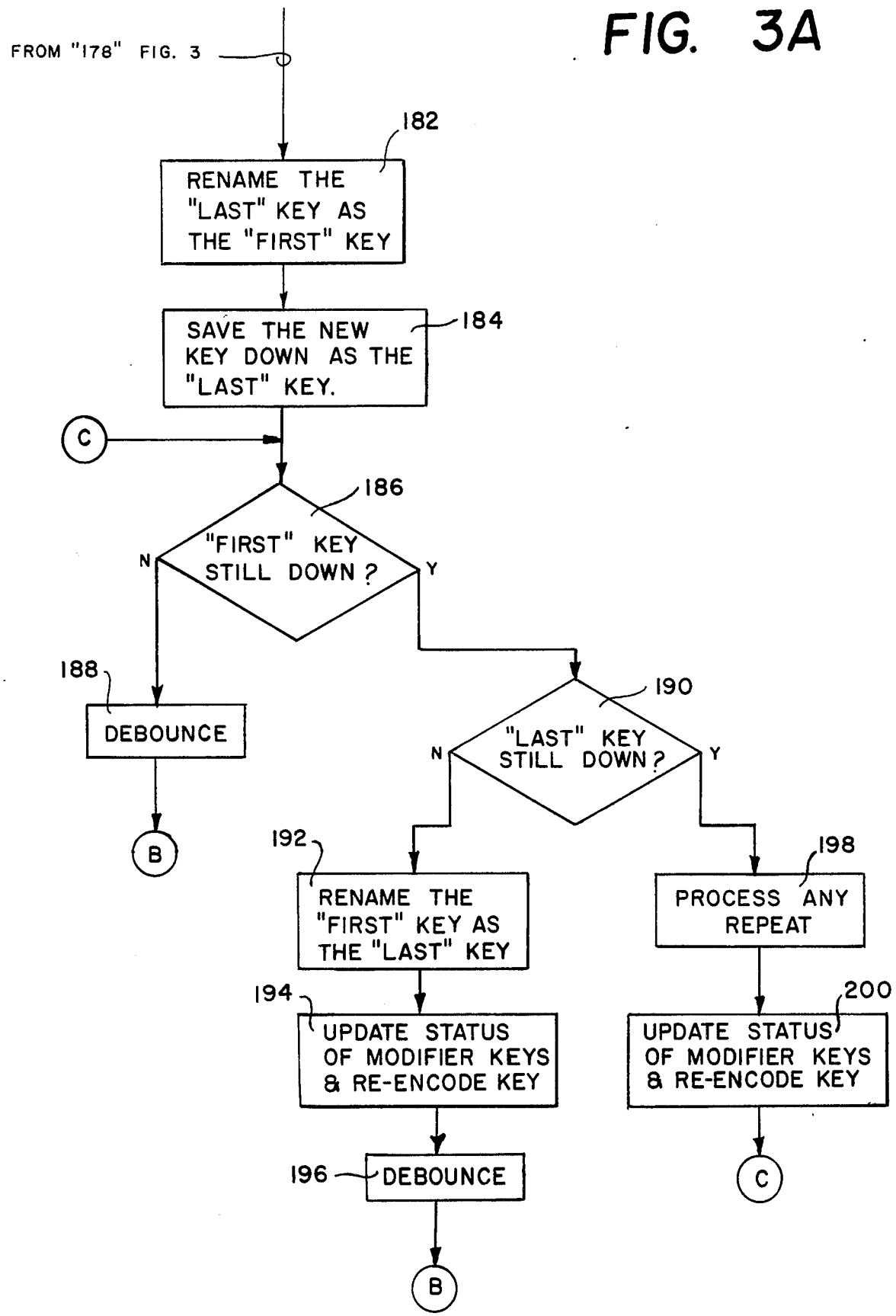

KEYBOARD SCANNING

BACKGROUND OF THE INVENTION

This invention relates generally to electronic keyboards, and is particularly directed to the detection of simultaneously engaged keys in a multi-key, high speed keyboard.

An experienced typist typically engages in rapid sequence desired keys on a multi-key keyboard. Although each key is sequentially engaged, at any given instant in time more than one key may be down. This requires high speed key detection and the ability to distinguish between simultaneously engaged keys. In a typical matrix-type keyboard, this calls for rapid scanning of the matrix by sequencing input signals to the columns, or rows, of the matrix and detecting an output signal representing a selected key in a given row, or column. The matrix keyboard includes a plurality of mechanical switches, each located at the intersection of a row and a column. Selection of a key results in closure of the switch and provides a signal path for indicating which key has been engaged.

A matrix switch arrangement utilizing mechanical switches possesses inherent limitations in detecting the simultaneous engagement of multiple keys. This is due to the manner in which the rows and columns are sequentially scanned and the ambiguities inherent in the simultaneous selection of more than one switch in a given row or column. One approach for solving this problem attempts to detect three simultaneously engaged keys forming a right angle in the matrix keyboard. If such an orientation of engaged keys is detected, the microprocessor controlling keyboard scan waits to report engagement of the third key until one of the first two keys is deselected. While this approach claims to solve the problem of "ghost key" engagement, it involves a somewhat complicated algorithm implemented by the microprocessor for detecting the required right angle orientation of the selected keys. In addition, this approach results in a relatively slow scan of the keyboard which raises the possibility of missed keys during high speed operation. The ideal system would be capable of detecting the simultaneous engagement of all keys (N) on the keyboard and of keeping track of the sequence in which each of the keys was selected. This capability is generally referred to as "N-key rollover" and while many systems claim to have this capability, virtually none do as it would require an overly complicated and expensive microprocessor controlled keyboard scanning routine. Most available systems offer something less than "N-key rollover" and represent a trade-off between capability and expense.

The present invention is intended to provide an improved keyboard scanning system and method particularly adapted for use in a mechanical matrix-type, multi-key keyboard which is inexpensive and highly reliable in rejecting spurious keyboard entry signals.

OBJECTS OF THE INVENTION

Accordingly, it is an object of the present invention to provide an improved keyboard scanning technique.

It is another object of the present invention to provide for the detection of simultaneously engaged keys in a multi-key, high speed keyboard.

A further object of the present invention is to provide an inexpensive and accurate means and method for the detection of simultaneously engaged keys in a high speed keyboard.

Still another object of the present invention is to provide an improved microprocessor-controlled keyboard entry scheme particularly adapted for high speed applications which reduces the possibility of erroneous key detection.

BRIEF DESCRIPTION OF THE DRAWINGS

The appended claims set forth those novel features believed characteristic of the invention. However, the invention itself as well as further objects and advantages thereof, will best be understood by reference to the following detailed description of a preferred embodiment taken in conjunction with the accompanying drawings, where like following reference characters identify like elements throughout the various figures, in which:

FIGS. 3 and 3A show the sequence of operations in the microprocessor of FIG. 2 in providing for keyboard scanning and key engagement detection in accordance with the present invention.

DESCRIPTION OF THE PREFERRED EMBODIMENT

Figure 1:
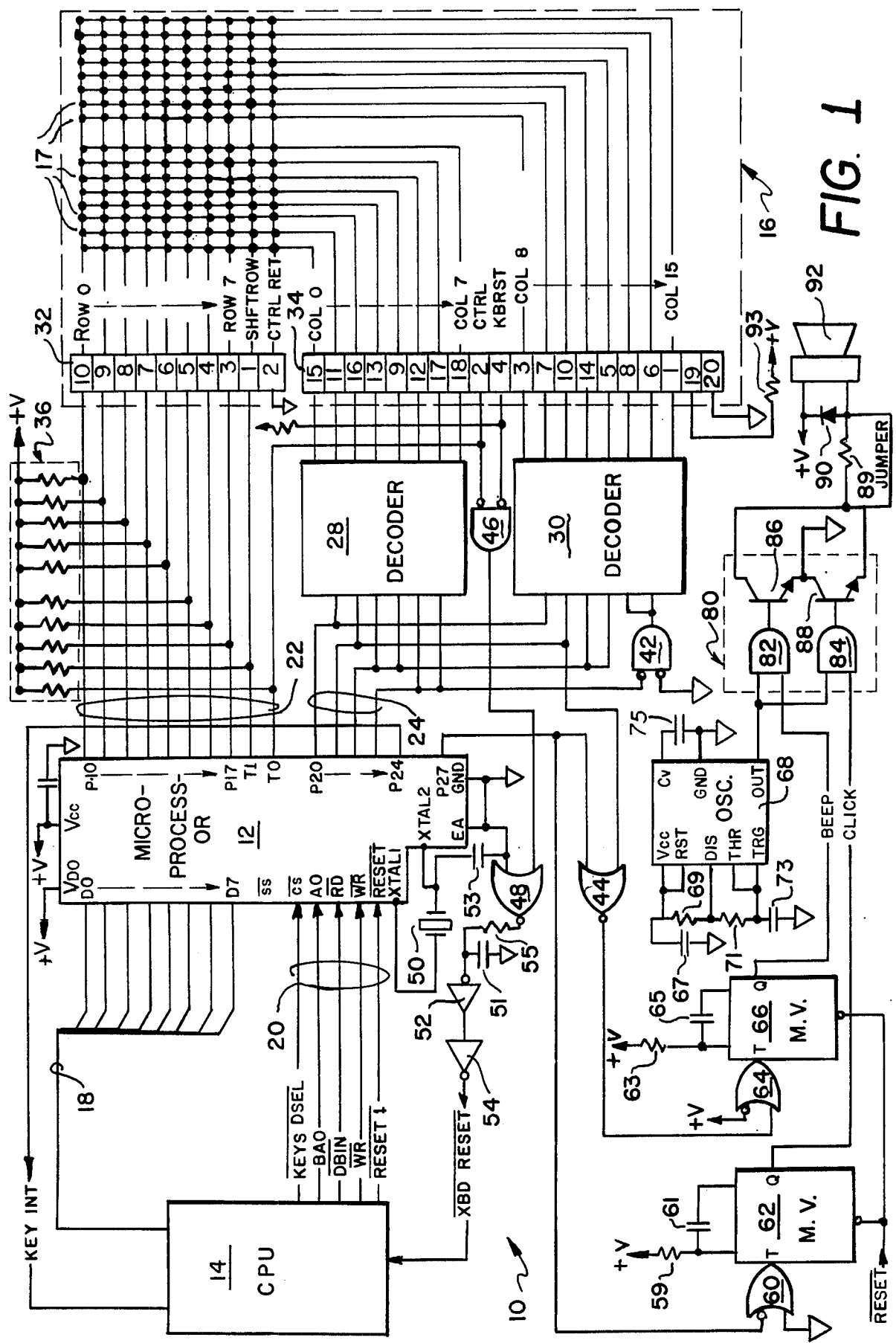
FIG. 1 illustrates partially in block diagram form and partially in schematic diagram form a keyboard scanning system in accordance with the present invention.

Referring to FIG. 1, there is shown in combination schematic and block diagram form a keyboard scanning system 10 in accordance with the present invention.

The keyboard scanning system 10 includes a microprocessor 12 for controlling system operation, a matrix-type keyboard 16 having a plurality of keys 17 for entering data into the system, and various other circuitry for implementing the various features of the invention as described below. Microprocessor 12 controls the keyboard scanning operation and interfaces with a central processing unit (CPU) 14 which exercises control over the system in which the keyboard scanning system 10 of the present invention is incorporated. CPU 14 typically would control the operation of a computer terminal as in the case of a word processor where data is entered via a keyboard 16 for presentation on a video display (not shown) and subsequent print-out in hard copy form. However, the present invention is not limited to use in a computer terminal, but has application in any system where data is entered via a keyboard under the control of a microprocessor. Various other features of the present invention include the generation of audio signals upon key selection and to indicate various operating modes of the system. The generation of these audio signals is described in detail below.

Microprocessor 12 is coupled to CPU 14 via a data bus 18 as well as a control bus 20. Data bus 18 includes a plurality of 3-state, bidirectional data bus lines by means of which CPU 14 reads the code of the pressed key of keyboard 16 from microprocessor 12, reads microprocessor 12 status information, and writes command words via the D0 through D7 pins of microprocessor 12. Various microprocessor control signals are provided via control bus 20. When CPU 14 addresses the microprocessor 12, the I/O port decoder (not shown) of CPU 14 asserts $\overline{\text{KEYBDSEL}}$ to the $\overline{\text{CS}}$ pin of microprocessor 12 for the activation thereof. The A0 address input provided to microprocessor 12 from CPU 14 indicates whether the byte transfer via the D0 through D7 pins is data (A0=0) or a command (A0=1) and is derived from the buffered address line BA0 from CPU 14. When the $\overline{DBIN}$ output from CPU 14 is asserted to the $\overline{RD}$ input pin of microprocessor 12, microprocessor 12 transfers its internal data to lines D0 through D7 and data from microprocessor 12 can then be loaded into the CPU's accumulator (not shown). When CPU 14 asserts the $\overline{WR}$ input to microprocessor 12, data provided by CPU 14 may be loaded into microprocessor 12. A $\overline{RESET}$ output from CPU 14 clears the microprocessor's status flip-flops and program counter (not shown) to 0 and initializes microprocessor 12 prior to the start of operation thereof. A crystal oscillator 50 provides a 6 MHz clocking signal to microprocessor 12 for proper operation of the circuits therein.

A plurality of bidirectional I/O lines 22 which are programmed as input lines to microprocessor 12 are coupled to a connector 32 for rows 0 through 7 of matrix keyboard 16. When a key (not shown) on keyboard 16 is selected, a signal from one of the column lines COL 0 through COL 15 is coupled to one of the row lines via column connector 34 in a conventional matrix switch manner. Microprocessor 12 notes which column is being strobed by checking an internal counter (not shown). By determining which row signal is low, microprocessor 12 determines which column was connected to which row when the key was pressed. From this information, microprocessor 12 then refers to a look-up table in an internal read only memory (ROM) and provides the appropriately coded signal to CPU 14 indicating which key on keyboard 16 has been selected. The T1 input pin is checked by microprocessor 12 when a key is selected to determine if the shift key (not shown) for providing capital letters is also pressed. If so, microprocessor 12 jumps to a routine in its operating program which translates the key pressed to its appropriate shifted code if it has one. Similarly, when a key is pressed, microprocessor 12 checks the T0 input line to determine if the control key (not shown) is selected. If the control key is selected, microprocessor 12 jumps to a routine that translates the key pressed to its appropriate control code, if it has one. Input pins T1 and T0 can be directly tested using conditional branch instructions by microprocessor 12. Each of the input lines 22 is coupled to a respective pull-up resistor for asserting the proper logic state to microprocessor 12. The pull-up resistors are generally shown in block 36.

A plurality of bidirectional I/O lines programmed as output lines 24 couple microprocessor 12 to column connector 34 of matrix keyboard 16 via decoders 28, 30. A 3-bit code output via lines P20, P21, and P22 is converted by decoders 28, 30 to one of eight outputs provided to column connector 34 and thence to a respective column of the matrix keyboard 16. The P23 output from microprocessor 12 determines which of decoders 28 or 30 is actuated by means of NOR gate 42 coupled to decoder 30. Thus, a low output from pin P23 of microprocessor 12 turns on decoder 28, while a high output provided from pin 23 to NAND gate 42 turns on decoder 30. In this manner, the three coded outputs from microcomputer pins P20, P21, and P22 are converted to one of sixteen outputs for the sequential scanning of the oolumn and row matrix of keyboard 16.

The combination of output lines P20 through P23 effectively converts decoders 28, 30 to a 4-line to 16-line decoder with microprocessor 12 pulsing these lines so as to cause a sequential transition in columns 0 through 7 followed by a sequential transition in columns 8 through 15, with the cycle continually repeated for updating key selection data. Decoders 28, 30 have open-collector outputs such that when a given key is deselected, the corresponding line will switch between a high impedance state and logic 0, rather than between a logic 1 and a logic 0. The P24 pin of microprocessor 12 is coupled to a bidirectional I/O line programmed as an output for asserting a KEYINT signal to CPU 14 for sending a keyboard interrupt to CPU 14 prior to placing data on data lines D0 through D7 to CPU 14.

Pin P27 of microprocessor 12 is coupled to a bidirectional I/O line programmed as an output for providing one input to OR gate 60 and one input to NOR gate 44. An output from pin P27 of microprocessor 12 indicates that a key closure has been detected and results in an output signal being provided to one input of OR gate 60. A P27 output from microprocessor 12 via OR gate 60 triggers multivibrator 62, resulting in a momentary high signal being provided to one input of AND gate 84 in peripheral drive circuit 80. The values of resistor 59 and capacitor 61 are selected to provide the desired duration of this signal A 1 KHz signal is provided from the output of oscillator 68 to AND gate 84.

The P27 output from microprocessor 12 is also NORed with the P21 output from microprocessor 12 in NOR gate 44. If both low inputs are provided to NOR gate 44, a high output is provided therefrom to one input of OR gate 64 which is coupled to the input of multivibrator 66. Triggering of multivibrator 66 results in a Q output therefrom for a predetermined duration established by the values of resistor 63 and capacitor 65. The output of multivibrator 66 is provided to one input of AND gate 82 of peripheral drive circuit 80. In addition, the values of resistor 59 and capacitor 61 and resistor 63 and capacitor 65 are selected such that multivibrator 62 outputs a pulse of relatively short duration and multivibrator 66 outputs a pulse of longer duration. Also providing inputs to AND gates 82, 84 of peripheral drive circuit 80 is oscillator circuit 68. Oscillator circuit 68 also provides a 1 KHz output in a preferred embodiment. AND gates 82, 84 are rendered conductive in response to the aforementioned inputs provided thereto for turning on NPN transistors 86, 88, respectively. The outputs from NPN transistors 86, 88 of peripheral drive circuit 80 are provided via current limiting resistor 89 and voltage limiting diode 90 to speaker 92. Thus, the time constant of one shot multivibrator 62 is selected to provide a relatively short period of a 1 KHz signal to speaker 92, while the output of multivibrator 66 provides a relatively long duration 1 KHz signal to speaker 92. The short 1 KHz pulse represents a click sounded upon selection of a key, while the longer 1 KHz pulse represents a beep upon key selection to provide an indication to the user of a special operating mode. For example, a beep sounded by speaker 92 may be desired when operating in a special mode to indicate selection of an illegal key in that mode. Thus, the P21 output of microprocessor 12 serves the dual purpose of providing a coded scan signal to keyboard 16 as well as an indication to speaker 92 of system operation in a special mode.

Figure 2:
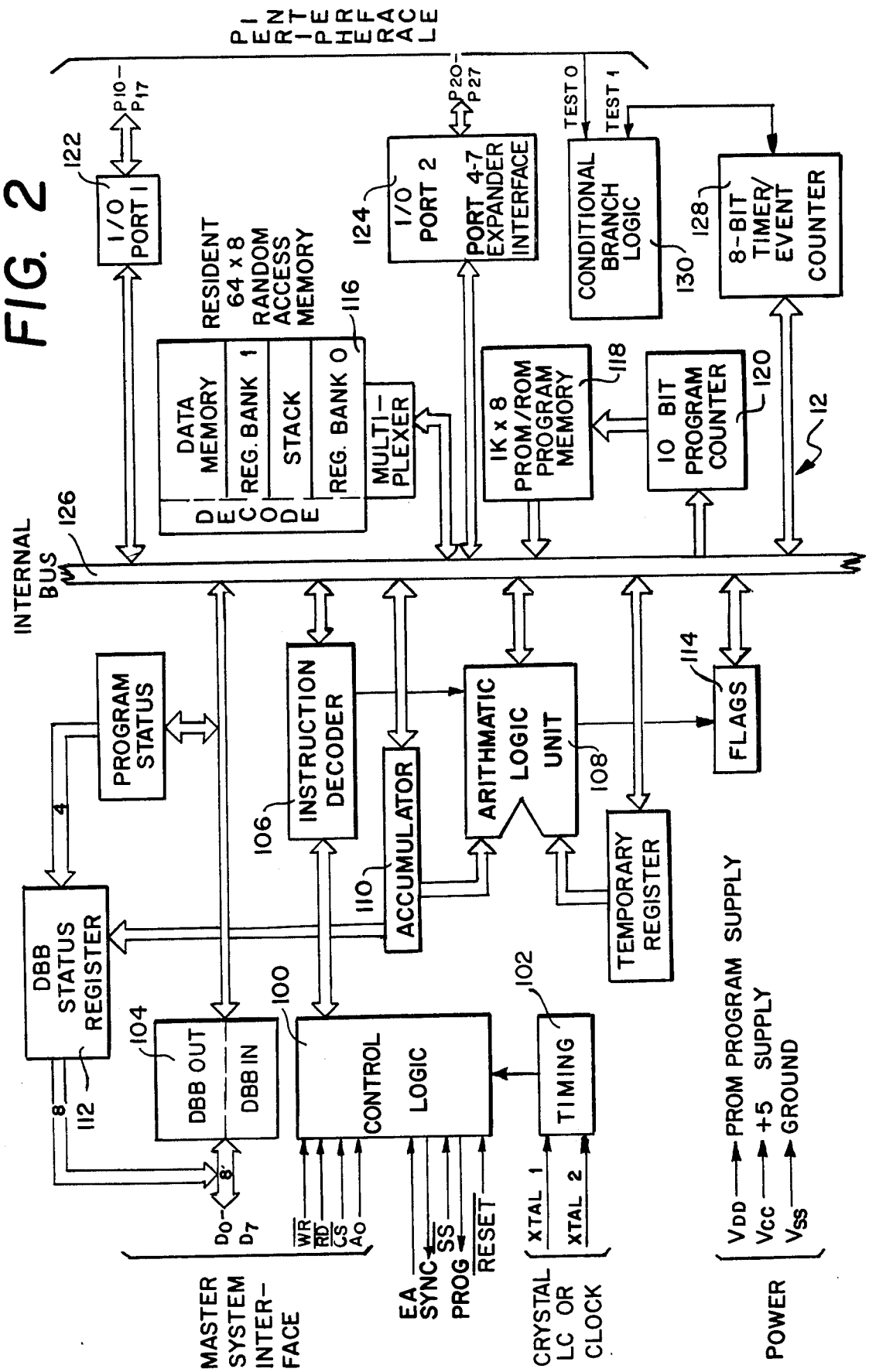
FIG. 2 shows a simplified block diagram of a microprocessor utilized in the keyboard scanning system of FIG. 1.

Referring to FIG. 2, there is shown in simplified block diagram form a microprocessor 12 used in a preferred embodiment of the present invention. An Intel 8741A microprocessor designed for use with a variety of 8-bit microcomputer systems and including a program memory, data memory, 8-bit CPU, I/O ports, timer/counter, and clock is used in a preferred embodiment of the present invention. Microprocessor 12 includes control logic 100 responsive to inputs received from CPU (not shown in FIG. 2) for providing coded instructions to instruction decoder 106 in generating commands for microprocessor execution. A timing circuit 102 responsive to XTAL 1 and XTAL 2 inputs from the external oscillator circuit (also not shown in FIG. 2) provides proper timing signals to control logic 100. Instruction decoder 106 deciphers the coded control inputs from the CPU and generates output commands used with various timing signals to control the functions of arithmetic logic unit (ALU) 108. ALU 108 in response to commands received from instruction decoder 106 performs various arithmetic and logic functions such as incrementing, decrementing, AND, OR, etc., and provides the results of these operations via the microprocessor's internal bus 126 to accumulator 110 for temporary storage therein. The contents of accumulator 110 are provided to data bus status register 112 which provides data to the data bus buffer 104. ALU 108 provides operating information to a flag circuit 114 for generating operating program flags reflecting predetermined status conditions and arithmetic functions.

The program memory 118 is a read only memory (ROM) which contains program instructions for controlling microprocessor 12 operation. A 16-bit program counter 120 monitors program instruction execution and insures proper sequencing of instructions output from ROM 118. The program stored in ROM 118 writes to or reads from the data memory 116 for transferring data to/from the data memory for carrying out the program instructions selected in ROM, or program memory, 118. A timer/event counter 128 receives program operating information from the microprocessor's internal bus 126 and provides timing information to conditional branch logic circuitry 130 to permit the operating program to make decisions and control its operation in response to the instructions read from program memory 118. I/O port 122 and I/O port 124 couple the internal bus 126 respectively to the P10 through P17 and P20 through P27 lines of microprocessor 12 and serve as a buffer for the signals provided from and to microprocessor 12 via the aforementioned pins, or lines. The configuration of microprocessor 12 as used in the present invention is conventional in design, does not form a part of the present invention, and will not therefore be described further herein.

Referring back to FIG. 1, microprocessor 12 may be reset via two key selected inputs from keyboard 16. These signals are CTRL and KBRST which are provided from keyboard 16 to NOR gate 46. In addition, the CTRL signal is provided to the T0 pin of microprocessor 12. The CTRL and KBRST signals from keyboard 16 go low upon selection of the keys causing NOR gate 46 to provide a high to NOR gate 48. The other input terminal of NOR gate 48 is coupled to neutral ground potential permitting NOR gate 48 to operate as an inverter with respect to the input signal provided thereto from NOR gate 46. The inverted output of NOR gate 48 is provided to inverter 52 via grounded capacitor 51 and resistor 55. The RC time constant associated with capacitor 51 and resistor 55 squares up the leading ledge of the output of NOR gate 48 and provides a signal time delay in providing a key debounce function to reduce the possibility of erroneous, or false, system reset. The output of inverter 52 is again inverted by inverter 54 in generating a $\overline{\text{KBDRESET}}$ signal which is provided to CPU 14 for resetting the entire keyboard scanning system 10. Inverter 54 is included to provide the proper logic level to CPU 14 for the resetting thereof. As explained, the input to NOR gate 48 is an active high signal while NOR gate 48 has a low active output. Therefore, a low active input is provided to inverter 52 and a high active input is output therefrom to inverter 54 for generating the $\overline{\text{KBDRESET}}$ for resetting the keyboard scanning system 10 via CPU 14.

Figure 3:
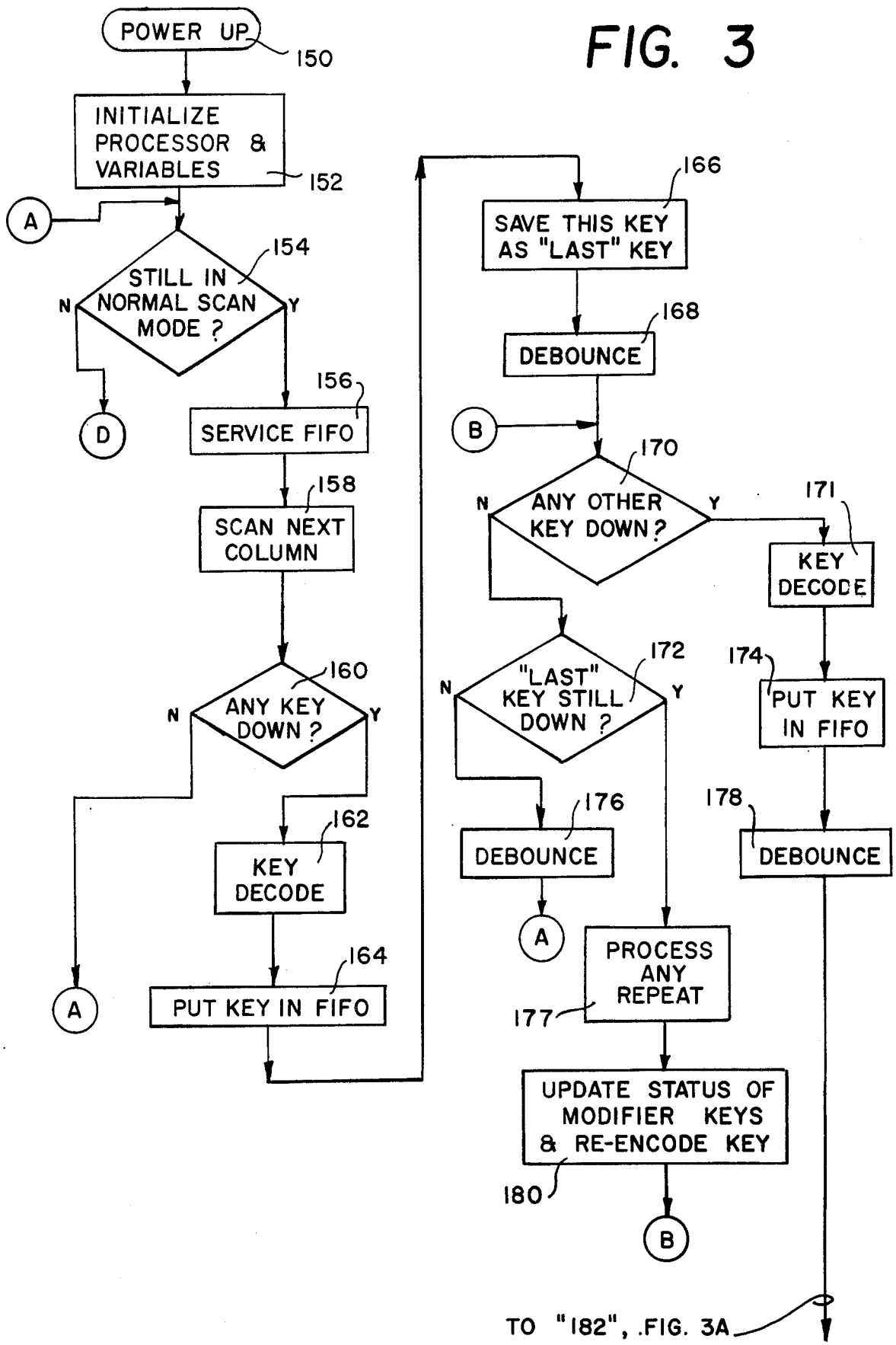

Referring to FIGS. 3 and 3A, there is shown the steps involved in scanning the matrix keyboard 16 in order to detect the simultaneous engagement of two separate keys and the deselection of either key so as to provide a reliable means and method for detecting simultaneous key entry in accordance with the present invention. In accordance with conventional flow chart practices, in FIGS. 3 and 3A an eliptical symbol indicates an action or condition for action by microprocessor 12, a diamond symbol indicates a decision point in the program routine being carried out by microprocessor 12, and a rectangle represents the effect or resulting state following a decision. The flow diagram shown in FIGS. 3 and 3A represents the program stored in the ROM 118 of microprocessor 12 which receives control inputs from CPU 14 and data and control inputs from keyboard 16.

The operations described in FIGS. 3 and 3A will now be explained with respect to FIG. 2. Power is initially applied to microprocessor 12 at step 150 prior to initiation of keyboard scanning. Similarly, following a reset operation the program stored in the microcomputer's ROM 118 will begin operation at step 150 as shown in FIG. 3. Following microprocessor power up, the memory storage locations in its RAM, or data memory, 116 and other portions of the microprocessor 12 are initialized to predetermined conditions established by the code stored in the CPU's ROM 118 at step 152. Data transferred from CPU 14 to microprocessor 12 includes keyboard scanning operating instructions and constants. Instructions output by CPU 14 are decoded by instruction decoder 106 before being transmitted to the various microprocessor controlled elements. Control logic in the form of the microprocessor's arithmetic logic unit (ALU) 108 then implements these instructions. At step 154 the program determines whether the keyboard scanning system is in a normal scan mode or in an alternate keyboard scanning mode. For example, an alternate scanning mode may be used when the keyboard is used to provide inputs in playing a video game, whereas the normal scan mode is utilized in a word processing application. If the program determines that it is not in a normal scan mode, it proceeds to a routine for carrying out the selected special scan mode shown at point "D". If the program determines that it is still in a normal scan mode of operation, it proceeds to step 156 and implements a FIFO (First In First Out) routine for data memory 116 in microprocessor 12. Data memory 116 processes data provided thereto in a first in/first out manner. The program then executes a scan of the next column in sequence at step 158 looking for a selected key and determines whether any key is down at step 160. If no key is detected as selected, the program returns to point "A" and step 154 where a determination of whether the system is in the normal scan mode is made and the program continues as described earlier.

If a key is determined as engaged at step 160, the program decodes that key at step 162 by means of the decode portion of data memory 116 and provides this decoded information to the FIFO data memory 116. At step 166 this decoded key information is stored in a first location, designated a "last" key location, for subsequent use. A key debounce routine is then executed at step 168 to verify that a key has indeed been selected.

The microprocessor 12 then continues to scan keyboard 16 looking for the engagement, or selection, of any other key at step 170. If no other key is detected as selected, the program then checks to determine whether the "last" key is still down at step 172 or has been deselected. A key debounce routine is executed at step 176 if the earlier selected key has been deselected and the program branches to point "A" in order to determine whether the system is in the normal scan mode at step 154. If the last key detected is still engaged at step 172, the program then executes a process any repeat routine at step 177 to determine if the auto repeat function has been enabled for repeating the selection of the "last" key automatically or if the "repeat key" (not shown) on keyboard 116 has been selected. At step 180 the program updates the status of the modifier keys, e.g., shift key, and re-encodes the selected key and proceeds to point "B" to detect the engagement of any other key at step 180.

Upon the detection of the engagement of a second key at step 170, the program then decodes the selected key at step 171 and provides that coded key input to the FIFO data memory 116 at step 174, performs a key debounce routine at step 178 for insuring valid key engagement, and shifts the contents of the "last" key location in data memory 116 to a second, predetermined location therein designated the "first" key location at step 182. The program then stores the most recently selected, or new, key code in the first memory location in data memory 116 termed the "last" key location at step 184. The program at step 186 then determines whether the "first" key is still engaged, and if the "first" key has been deselected, a key debounce routine is performed at step 188 with the program returning to point "B" for detecting the selection of any other key at step 170.

If the "first" key detected is still engaged at step 186, the program then determines whether the "last" key is still down at step 190 and performs a branching function. If the "last" key is still down, the program again processes any repeat instruction at step 198, as previously explained, and updates the status of the modifier keys and re-encodes the selected "last" key in accordance with the modifier keys selected at step 200 and returns to point "C" in the program in order to detect when the "first" key has been deselected at step 186. If the "last" key is detected as deselected at step 190, the program renames the "first" key as the "last" key by shifting the coded contents of the second memory location in data memory 116 to the aforementioned first memory location therein. Thus, the keyboard scanning in accordance with the present invention is able to keep track of the relative order of selection of first and second keys and, in order to simplify the scanning operation and maintain the present invention as an economical approach offering high speed and accurate key selection detection, processes only the last two selected keys. It is only after one of these two keys has been deselected, that the program looks for a third selected key. Following the redesignating of the "first" as the "last" key at step 192, the program then updates the status of the modifier keys and re-encodes the selected key in accordance with this update at step 194, performs a key debounce routine at step 196, and returns to point "B" to detect the engagement of any other key at step 170.

There has thus been shown an improved keyboard scanning system and method in which only the last two selected keys and the order in which they were selected is detected and stored in memory. Engagement of a special mode key such as a capital letter or letter repeat key is asserted only with respect to the intended key even if both keys are selected at the same time. The present invention reduces the possibility of erroneous key detection while providing for the accurate and rapid detection of an engaged key in a matrix-type keyboard.

While particular embodiments of the invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention. The matters set forth in the foregoing description and accompanying drawings is offered by way of illustration only and not as a limitation. The actual scope of the invention is intended to be defined in the following claims when viewed in their proper perspective based on the prior art.

We claim:

1. In a matrix-type keyboard having a plurality of selectively engageable keys representing a plurality of alphanumeric characters and operating modes and signal processing means including memory means having a plurality of locations for the detection and storage of engaged key information therein, a method for detecting the simultaneous engagement of more than one of said keys comprising:

sequentially generating a plurality of first scan signals and providing said scan signals to said keyboard for the sequential scan thereof;

detecting a first output scan signal from said keyboard representing the engagement of a first alphanumeric character key therein;

storing said first output scan signal in a first location in said memory means;

sequentially generating a plurality of second input scan signals and providing said scan signals to said keyboard for the sequential scan thereof;

detecting a second output scan signal from said keyboard representing a second alphanumeric character key engaged simultaneously with said first key;

storing said second output scan signal in a second location in said memory means;

detecting the deselection of said first key or said second key;

storing said second output scan signal in said first memory location if said first key has been deselected;

detecting the engagement of a key representing an operating mode following the selection of said second key;

sequentially generating a plurality of third input scan signals and providing said scan signals to said keyboard for the sequential scan thereof;

detecting a third output scan signal from said keyboard representing the engagement of a third alphanumeric character key therein; and storing said third output scan signal in said second location in said memory means.

2. A method in accordance with claim 1 further comprising the step of delaying execution of the next succeeding step following detection of key engagement in verifying a valid key engagement.

3. A method in accordance with claim 1 further comprising the step of generating an audio tone following detection of a key engagement in providing an aural indication thereof.

4. A method in accordance with claim 1 further comprising the steps of providing said matrix-type keyboard with a plurality of intersecting rows and columns of conductors and a plurality of switches and coupling each of said switches to a respective key and an intersection of one of said rows and one of said columns of said conductors for providing the input scan signals to said keyboard for the sequential scan thereof and for detecting the output scan signals from said keyboard representing the engagement of a key therein.

5. A method in accordance with claim 4 wherein said plurality of columns of conductors are sequentially scanned by said input scan signals with an output scan signal provided to said signal processing means from a respective one of said row of conductors corresponding to an engaged key.

6. A method in accordance with claim 1 wherein a key representing one of said operating modes includes an automatic key repeat function.

7. A system for detecting the simultaneous engagement of more than one key in a matrix-type keyboard having a plurality of selectively engageable keys representing a plurality of alphanumeric characters and operating modes, wherein said keyboard provides an output signal representing the selection of a given key, said system comprising:

signal generating means coupled to said keyboard for generating first and second pluralities of scan signals for sequentially scanning said keyboard;

signal processing means coupled to said keyboard for simultaneously receiving first and second output signals from said keyboard representing the selection of first and second alphanumeric character keys engaged at the same time, wherein said first key is selected first;

memory means coupled to said signal processing means and including first and second memory locations for storing said first and second output signals, wherein said first output signal is initially stored in said first memory location and is subsequently stored in said second memory location following the detection and storage of said second output signal in said first memory location;

key detection means coupled to said keyboard for detecting the deselection of said first or second keys;

means for detecting the engagement of an operating mode key following the engagement of said second key; and data transfer means coupled to said key detection means and said memory means and responsive to the deselection of said first key for transferring said second output signal to said first memory location following the deselection of said first key, wherein a third output signal representing the engagement of a third alphanumeric character key generated in response to a third plurality of scan signals provided by said signal generating means to said keyboard is stored in said first memory location.

8. A system in accordance with claim 7 further including audio signal generating means coupled to said signal generating means and said keyboard for providing an aural signal upon engagement of a key on said keyboard.

9. A system in accordance with claim 7 wherein said operating mode key comprises a repeat key for automatically repeating the alphanumeric character key engaged immediately preceding the selection of said repeat key.

10. A system in accordance with claim 7 wherein said keyboard includes a plurality of keys organized in an array of rows and columns having a plurality of keyboard input address lines corresponding in number to the number of columns and to which said scan signals are provided and further having a plurality of keyboard output data lines corresponding in number to the number of rows and coupled to said signal processing means.

11. A system in accordance with claim 7 wherein said signal generating means, said signal processing means, said memory means and said data transfer means are included in a microprocessor and wherein said system further includes a CPU coupled to said microprocessor for receiving data therefrom and providing instructions and data thereto in exercising control over said system.

* * * * *